US008399864B2

(12) United States Patent
Hill et al.

(10) Patent No.: US 8,399,864 B2
(45) Date of Patent: Mar. 19, 2013

(54) DUAL BEAM SYSTEM

(75) Inventors: Raymond Hill, Rowley, MA (US);
Lawrence Scipioni, Beaverton, MA (US); Colin August Sanford, Atkinson, NH (US); Mark DiManna, Fremont, NH (US); Michael Tanguay, York, ME (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/222,536

(22) Filed: Aug. 31, 2011

(65) Prior Publication Data
US 2011/0309263 A1 Dec. 22, 2011

Related U.S. Application Data

(63) Continuation of application No. 12/576,914, filed on Oct. 9, 2009, now Pat. No. 8,013,311, which is a continuation of application No. 11/641,540, filed on Dec. 18, 2006, now Pat. No. 7,601,976, which is a continuation of application No. 10/889,967, filed on Jul. 13, 2004, now Pat. No. 7,161,159.

(60) Provisional application No. 60/487,792, filed on Jul. 14, 2003.

(51) Int. Cl.
*H01J 37/26* (2006.01)
*H01J 37/141* (2006.01)
(52) U.S. Cl. ............ 250/492.21; 250/492.1; 250/492.3; 250/493.1; 250/396 ML; 250/396 R
(58) Field of Classification Search .............. 250/396 R, 250/396 ML, 492.21, 492.3, 493.1
See application file for complete search history.

(56) References Cited

U.S. PATENT DOCUMENTS

| 3,131,289 | A |   | 4/1964  | Hansen                    |
|-----------|---|---|---------|---------------------------|
| 3,699,334 | A |   | 10/1972 | Cohen et al.              |
| 4,345,152 | A | * | 8/1982  | Gerlach ............ 250/396 ML |
| 4,701,620 | A |   | 10/1987 | Okumura et al.            |
| 4,818,872 | A | * | 4/1989  | Parker et al. .......... 850/1 |
| 5,093,572 | A |   | 3/1992  | Hosono                    |
| 5,206,516 | A |   | 4/1993  | Keller et al.             |
| 5,270,552 | A |   | 12/1993 | Ohnishi et al.            |
| 5,376,791 | A |   | 12/1994 | Swanson et al.            |
| 5,574,280 | A |   | 11/1996 | Fujii et al.              |
| 5,825,038 | A |   | 10/1998 | Blake et al.              |
| 5,990,476 | A | * | 11/1999 | Larson et al. ........ 250/251 |

(Continued)

FOREIGN PATENT DOCUMENTS

| JP | 5981850 | 5/1984 |
| JP | 1017364 | 1/1989 |

(Continued)

OTHER PUBLICATIONS

"Focused Ion Beam Technology, Capabilities and Applications," Jan. 1, 2006, http://www.fei.com/uploadedFiles/Documents/Content/2006_06_FIB_Overview.pb.pdf, 20 pages.

(Continued)

*Primary Examiner* — David A Vanore
(74) *Attorney, Agent, or Firm* — Scheinberg & Associates, PC; Michael O. Scheinberg; John B. Kelly

(57) ABSTRACT

A dual beam system includes an ion beam system and a scanning electron microscope with a magnetic objective lens. The ion beam system is adapted to operate optimally in the presence of the magnetic field from the SEM objective lens, so that the objective lens is not turned off during operation of the ion beam. An optional secondary particle detector and an optional charge neutralization flood gun are adapted to operate in the presence of the magnetic field. The magnetic objective lens is designed to have a constant heat signature, regardless of the strength of magnetic field being produced, so that the system does not need time to stabilize when the magnetic field is changed.

7 Claims, 12 Drawing Sheets

U.S. PATENT DOCUMENTS

| | | | |
|---|---|---|---|
| 6,047,083 A | 4/2000 | Mizuno | |
| 6,051,839 A | 4/2000 | Crewe | |
| 6,130,432 A | 10/2000 | Pfeiffer et al. | |
| 6,218,663 B1 | 4/2001 | Nisch et al. | |
| 6,303,932 B1 * | 10/2001 | Hamamura et al. | 850/43 |
| 6,335,532 B1 | 1/2002 | Tanaka et al. | |
| 6,414,307 B1 | 7/2002 | Gerlach et al. | |
| 6,452,172 B1 | 9/2002 | Oi | |
| 6,452,173 B1 * | 9/2002 | Oi | 850/43 |
| 6,486,471 B1 | 11/2002 | Oi | |
| 6,497,194 B1 * | 12/2002 | Libby et al. | 118/723 FI |
| 6,515,287 B2 | 2/2003 | Notte, IV | |
| 6,538,254 B1 | 3/2003 | Tomimatsu et al. | |
| 6,566,897 B2 | 5/2003 | Lo et al. | |
| 6,683,320 B2 * | 1/2004 | Gerlach et al. | 250/494.1 |
| 6,753,538 B2 * | 6/2004 | Musil et al. | 250/492.2 |
| 6,770,867 B2 * | 8/2004 | Lezec et al. | 250/252.1 |
| 6,774,379 B2 | 8/2004 | Hashimoto | |
| 6,781,125 B2 * | 8/2004 | Tokuda et al. | 850/1 |
| 6,824,644 B2 * | 11/2004 | Athas et al. | 156/345.24 |
| 6,838,667 B2 | 1/2005 | Tsuneta et al. | |
| 6,838,668 B2 | 1/2005 | Begrer et al. | |
| 6,852,982 B1 * | 2/2005 | Bierhoff et al. | 250/396 ML |
| 6,855,938 B2 | 2/2005 | Preikszas et al. | |
| 6,858,851 B2 | 2/2005 | Tomimatsu et al. | |
| 6,900,447 B2 * | 5/2005 | Gerlach et al. | 250/494.1 |
| 7,161,159 B2 * | 1/2007 | Hill et al. | 250/399 |
| 7,411,192 B2 | 8/2008 | Takeuchi et al. | |
| 7,601,976 B2 * | 10/2009 | Hill et al. | 250/492.3 |
| 7,662,524 B2 | 2/2010 | Stewart et al. | |
| 8,013,311 B2 * | 9/2011 | Hill et al. | 250/396 ML |
| 2003/0020016 A1 | 1/2003 | Frosien | |
| 2004/0129878 A1 * | 7/2004 | Tomimatsu et al. | 250/307 |
| 2008/0314871 A1 | 12/2008 | Toth et al. | |
| 2009/0242759 A1 | 10/2009 | Bray et al. | |
| 2009/0309018 A1 | 12/2009 | Smith et al. | |
| 2010/0025578 A1 | 2/2010 | Hill et al. | |
| 2010/0127190 A1 | 5/2010 | Straw et al. | |
| 2010/0243889 A1 | 9/2010 | Faber et al. | |
| 2011/0115129 A1 | 5/2011 | Straw et al. | |
| 2011/0163068 A1 | 7/2011 | Utlaut et al. | |

FOREIGN PATENT DOCUMENTS

| | | |
|---|---|---|
| JP | 3-82110 | 4/1991 |
| JP | 3152844 | 6/1991 |
| JP | 3234417 | 10/1991 |
| JP | 3117711 | 12/1991 |
| JP | 4-73847 | 3/1992 |
| JP | 06-208838 | 7/1994 |
| JP | 6318443 | 11/1994 |
| JP | 7230784 | 8/1995 |
| JP | 8115696 | 5/1996 |
| JP | 9257670 | 3/1997 |
| JP | 11-238483 | 8/1999 |
| WO | 2010006067 | 1/2010 |

OTHER PUBLICATIONS

Saghi, Zineb, et al., "Tomographic Nanofabrication of Ultrasharp Three-Dimensional Nanostructures," Applied Physics Letters, Oct. 13, 2008, 3 pages, vol. 93, No. 15.

Gnauck, Peter, et al., "A New CrossBeam Inspection Tool Combining an Ultrahigh Resolution Field emission SEM and a High Resolution FIB", Proceedings of SPIE, 2002, pp. 833-840, vol. 4689.

Pawley, J.B., "Use of Pseudo-Stereo Techmques to Detect Magnetic Stray Field in the SEM", Scanning, Mar. 6, 1987, pp. 134-136, vol. 9, Issue 3.

\* cited by examiner

DUAL BEAM SYSTEM

This application is a continuation of U.S. patent application Ser. No. 12/576,914, filed Oct. 9, 2009, which is a continuation of U.S. patent application Ser. No. 11/641,540, filed on Dec. 18, 2006, and issued as U.S. Pat. No. 7,601,976, which is a continuation of U.S. patent application Ser. No. 10/889,967, filed on Jul. 13, 2004, and issued as U.S. Pat. No. 7,161,159, which claims priority from U.S. Provisional Pat. App. 60/487,792, filed Jul. 14, 2003, all of which are hereby incorporated by reference.

TECHNICAL FIELD OF THE INVENTION

The present invention relates to charged particle beam systems, and in particular to systems including an ion beam column and an electron beam column using a magnetic objective lens.

BACKGROUND OF THE INVENTION

Charged particle beam systems are used in a variety of applications, including the manufacturing, repair, and inspection of miniature devices, such as integrated circuits, magnetic recording heads, and photolithography masks. Dual beam systems often include a scanning electron microscope (SEM) that can provide a high-resolution image with minimal damage to the target, and an ion beam system, such as a focused or shaped beam system, that can be used to alter substrates and to form images.

One common application for a dual beam system is to expose a buried portion of a substrate and then to form an image of the exposed surface. For example, a focused or shaped ion beam can be used to make a vertical cut in a substrate to expose a cross sectional surface, and then an electron beam can be scanned over the newly exposed surface to form an image of it.

One difficulty with such systems is that the final lens of the scanning electron microscope produces a magnetic field, which alters the trajectory of the ion beam and also interferes with various other functions of the dual beam system. For example, an image or information about the composition of the substrate can be obtained by collecting secondary particles ejected as the primary ion beam strikes target. The magnetic field of the SEM, however, changes the path of the secondary particles and makes them difficult to collect.

When a work piece in a charged particle beam system is composed of an insulating material, such as quartz, the work piece tends to accumulate electrical charge that adversely affects the primary beams and secondary particles. One method of neutralizing the change entails the use of an electron flood gun that directs electrons to the work piece to neutralize positive charge. An electron flood gun differs from an electron microscope in that the flood gun lack precise optics options and produces a relatively broad beam of low energy electrons. The magnetic field of the SEM changes the path of the neutralizing electrons from the flood gun and makes it difficult to direct them accurately toward the work piece.

A common solution to this problem of the magnetic field interference is to turn off the SEM when using the ion beam or when using certain functions of the ion beam system. For example, the SEM can be switched off to allow collection of the ion beam induced secondary particles or when using a charge neutralization flood gun. Turning the SEM lens on and off creates its own set of problems.

The magnetic objective lens of an SEM uses a significant electrical current and therefore generates a significant amount of heat, the heat being proportional to the square of the current. The heat dissipated by an SEM causes components of the dual beam system to expand. The resolution of an SEM, being on the order of magnitude of nanometers requires a very stable physical platform, and the system therefore requires a significant amount of time after being turned on to reach thermal equilibrium and become stable. As the resolution of systems has increased, stability has become more important, and longer waits are required. Charged particle beam systems were originally used only in laboratories to analyze samples, and the time to reach thermal equilibrium was acceptable. Systems are now being used as production equipment and such delays are unacceptable.

U.S. Pat. No. 4,345,152 for a "Magnetic Lens" describes an electron lens that uses two coils having equal numbers of turns wound in opposite directions. By altering the allocation of current between the two coils, the magnetic field could be adjusted to focus the electron beam while maintaining a constant total current, and therefore a constant heat output. Using two lenses of equal turns allows the magnetic field to be varied or even cancelled without changing the total electrical current in the lens. Thus, the magnetic field could be eliminated without changing the heat output of the lens.

The surface viewed by the SEM is often oriented at a non-perpendicular angle to the SEM axis, so one part of the work piece is closer to the lens than another part. To compensate for the difference in distance, some SEMs change the focus of the objective lens during the scan and can therefore produce a clearer image. This is often referred to as "dynamic focusing." Dynamic focusing requires the ability to rapidly change the magnetic field, which requires rapidly changing the electrical current in the objective lens coils. The coil inductance, which is related to the number of turns of the coil, resists a current change.

The two equal coils in U.S. Pat. No. 4,345,152 have high inductance and cannot be changed rapidly. It is also known to use a separate, small lens for dynamic focusing. Such lenses have low inductance, but changing the lens current changes the power dissipation of the lens, which can upset the thermal equilibrium of the system, thereby reducing resolution.

If one designed a dual beam system to compensate for the effects of a constant magnetic field from the SEM objective lens, the problem would not be solved completely, because the magnetic field is not constant. To keep the SEM in focus, the magnetic field of the objective lens is changed depending upon the height of the work piece, the magnification, and the electron energy. In some system, it is possible to reduce the operating variation in the magnetic field by using "retarding field optics," that is, changing the voltage of the work piece to change the focus of the electron beam, rather than changing the magnetic field in the objective lens. In many dual beam systems, the FIB is mounted vertically and the SEM is mounted at an angle to view to vertical cross section cut by the FIB. A system in which the SEM is tilted cannot easily use retarding field options, since the tilt eliminates the symmetry of the retarding electric field and causes undesirable aberrations in the primary electron beam and difficulty in the collection of secondary electrons.

SUMMARY OF THE INVENTION

An object of the invention is to provide a dual beam system in which an ion beam can operate while the SEM lens has current flowing in it.

One aspect of the invention comprises a dual beam system in which the objective lens of an SEM can be energized while other functions of the system can still be used. A preferred embodiment includes several inventive aspects that are believed to be separately patentable. The SEM produces a constant heat generation so that the system does not need extra time to reach thermal equilibrium when the magnetic field strength is changed to focus the beam. In some embodiments, a charge neutralization flood gun is positioned so that the magnetic field helps to direct the neutralizing electrons to the target. In some embodiments, steering electrodes in the flood gun alter the beam direction to compensate for changes in the magnetic field.

Some embodiments include a secondary particle detector that is positioned such that the magnetic field of the SEM lens helps in the collection of secondary particles. Another embodiment uses monoisotopic gallium that eliminates blurring of the ion beam caused by the different effects of the SEM magnetic field with the different isotopes of gallium.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and the advantages thereof, reference is now made to the following descriptions taken in conjunction with the accompanying drawings, in which:

FIG. 16A shows the docking mechanism in isolation mode and FIG. 16B shows the docking mechanism in docking mode.

DETAILED DESCRIPTION OF THE PREFERRED EMBODIMENTS

Figure 1:
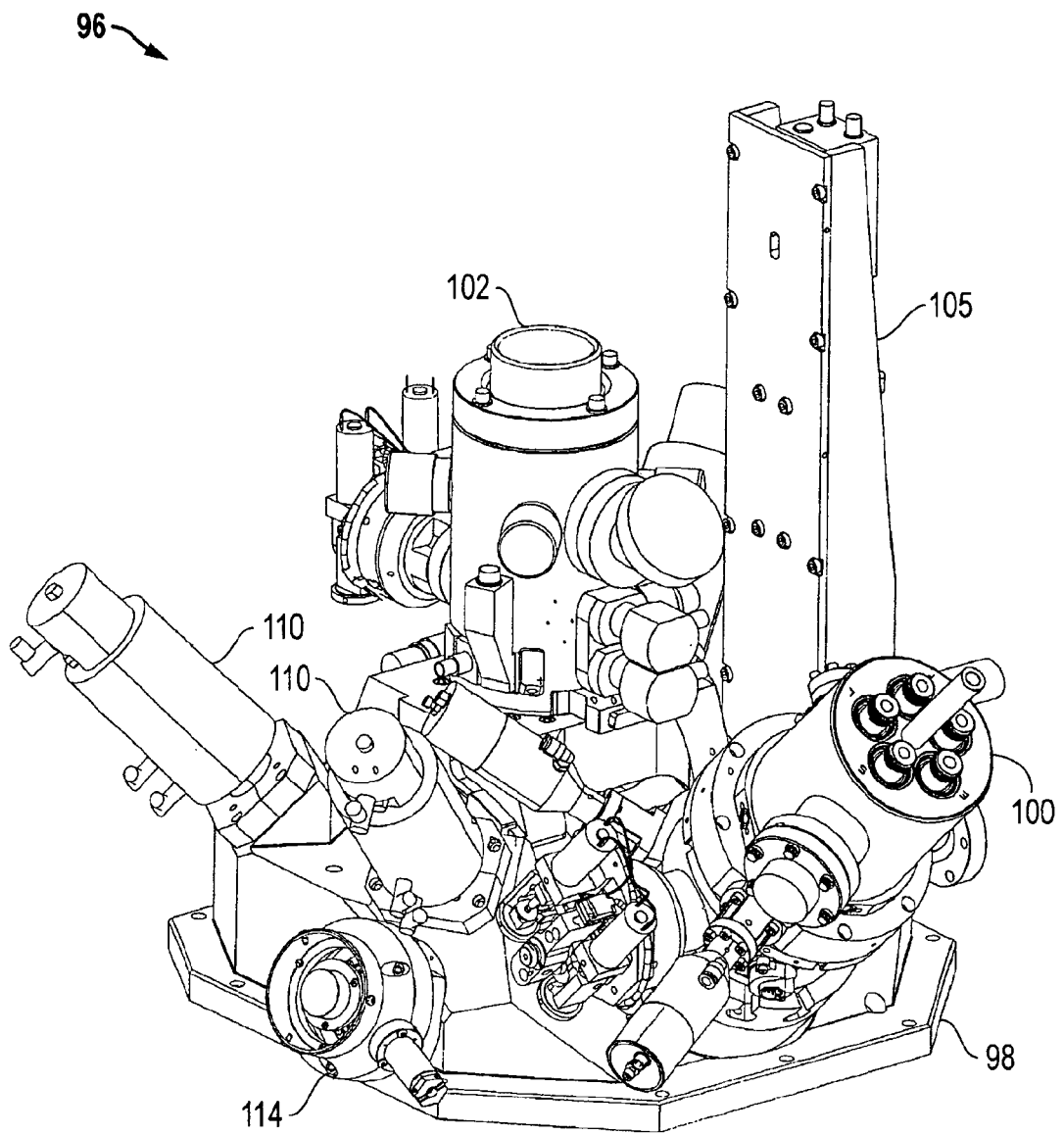
FIG. 1 shows part of a dual beam system embodying aspects of the invention
Figure 2:
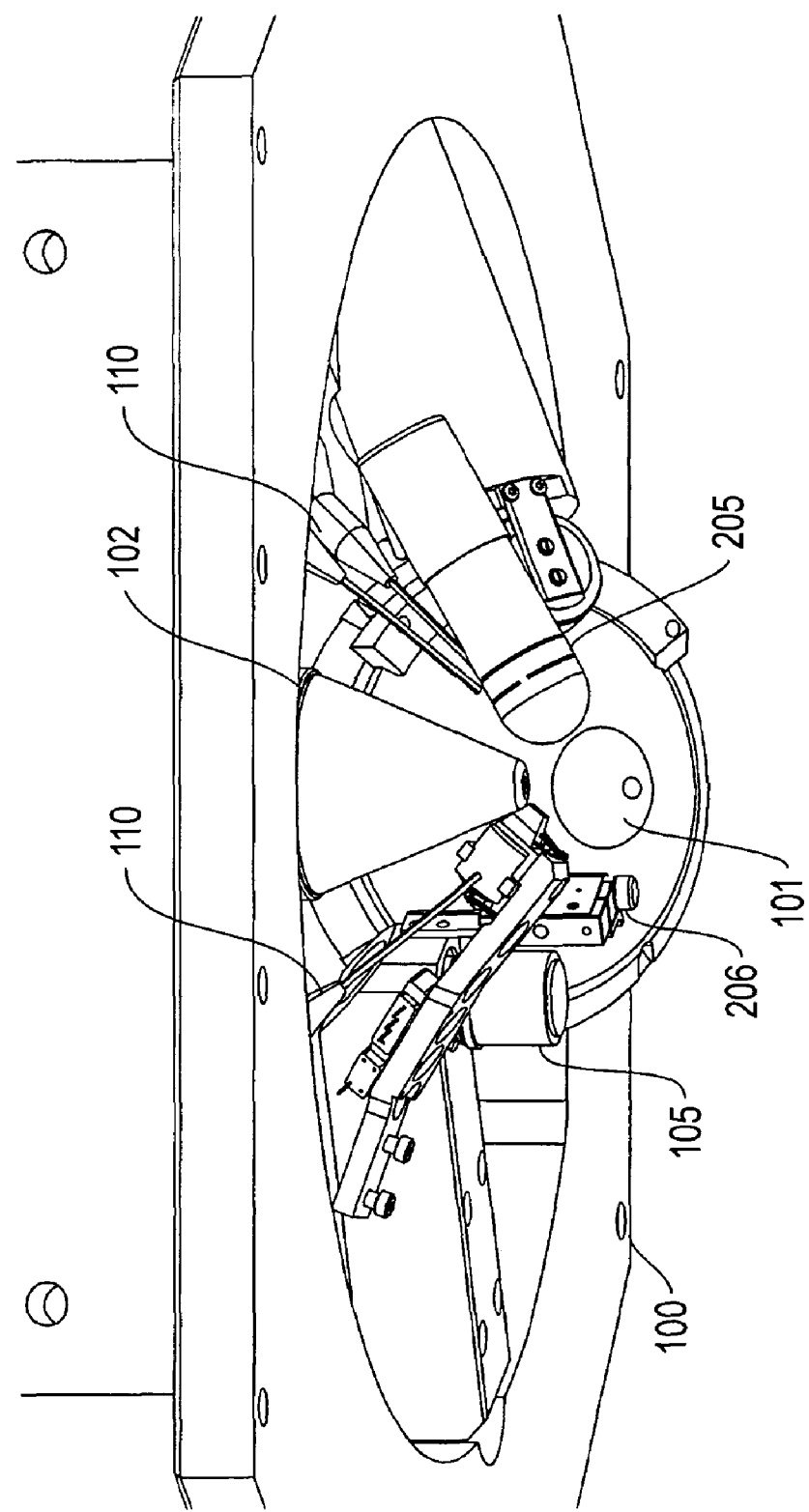
FIG. 2 shows a bottom perspective view of the part of the system shown in FIG. 1.

FIG. 1 shows a portion of a dual beam system 96 that includes a turret 98 upon which are mounted an scanning electron microscope 100, an ion beam column 102, a light microscope 105, one or more gas injection systems (GIS) 110, and an electron detector 114 that detects electrons collected through the lens of SEM 100 and deflected away from the primary electron beam axis. FIG. 2 shows the same component as seen from underneath, that is, as seen from the work piece surface. A charge neutralization flood gun 204 and a secondary particle detector 205, such as a channel detector electron multiplier (CDEM) that detects particles generated from the work piece by the impact of ions from ion beam column 102, are visible in FIG. 2.

Although the ion beam and the electron beam ideally point to the identical spot on the work piece, the physical sizes of the electron beam column and the ion beam column typically prevent them from being positioned very close to the surface and directed toward the same target spot. To have both beams pointing to the same spot, one or both beams must typically be backed away from the surface. Backing a column away from the surface increases the working distance, that is, the from the column final lens to the work piece surface. Increasing the working distance reduces the resolution of the column.

In a preferred embodiment that provides a short working distance for both columns, the impact points from the SEM 100 and the FIB 104 are offset from each other, for example, by about 50 mm. The work piece is mounted in a work piece holder or stage (not shown) that moves the work piece rapidly and accurately between the two spots depending upon which beam is being used. As the stage moves in the X-Y plane to position the work piece under the appropriate beam column, the stage also moves vertically to compensate for variations in the surface height of the work piece. Such surface height variations can be caused, for example, by warp in a semiconductor wafer.

A height sensor, such as a capacitive sensor 206 (FIG. 2), detects a change in height of the work piece surface as the stage is moved and raises or lowers the stage so that the work piece does not collide with any of the instruments in the vacuum chamber and so that the work piece is in focus regardless of which beam is being applied to the work piece. In one embodiment, the capacitive sensor 206 is conveniently mounted on and extends from optional optical microscope 105. The optical microscope 105 can be used for preliminary alignment of the work piece.

The various components of the system, such as SEM 100, FIB 102, and GISs 110, are mounted on turret 98, which comprises the upper portion of a sample vacuum chamber. The turret includes various openings upon which instruments can be mounted or which can be readily sealed if not needed. By using such a turret, different charged particle beam systems can be readily configured from the same basic system. For example, different types of detectors or different numbers of gas injection systems can be mounted onto the turret to create a special or general purpose charged particle beam system, without having to design a system entirely from scratch.

Flood Gun

The neutralizing electrons from the flood gun preferably land on the work piece at the point where the charge is accumulating, that is, near the impact point of the primary ion beam. The charge neutralizing electrons also preferably land on the work piece with a minimum of energy. In a preferred system in which the SEM objective lens is maintained in an energized state, the magnetic field from the objective lens distorts the trajectory of electrons from flood gun 204 and can make them miss the area to be neutralized. The magnetic field from the SEM objective lens is typically around 20 Gauss near the ion beam impact point on the work piece. During operation of the SEM objective lens, the magnetic field can vary by a factor of two or more, as the strength of the lens is adjusted to maintain focus under different conditions.

The magnetic field generated by the SEM objective lens affects the neutralizing electrons not only after they leave the flood gun, but also within the flood gun as the electron beam is being produced. Although it would be possible to shield the flood gun using a material of high magnetization, referred to as a "mu-metal" material, such a magnetic shield would alter the magnetic field in the vacuum chamber and would adversely affect the focusing of the SEM. One solution is to turn off the SEM lens when using charge neutralization with the FIB beam but, as described above, turning on and off the SEM objective lens upsets the thermal equilibrium of the system and necessitates a waiting period for the system to reach thermal equilibrium.

Figure 3:
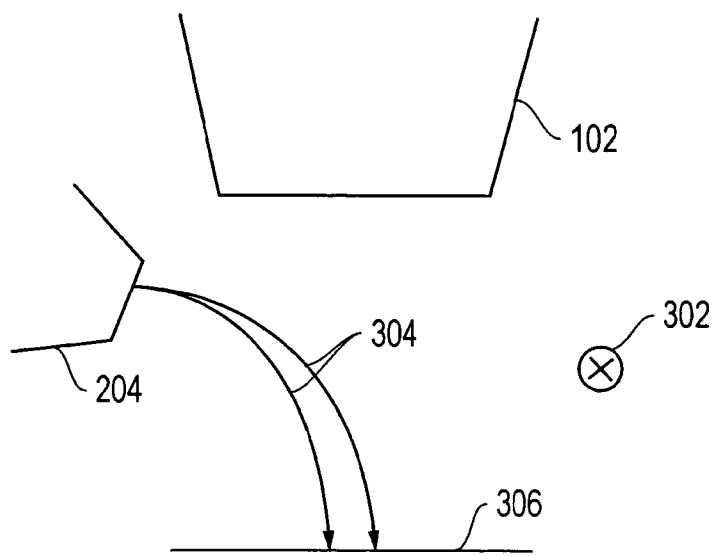
FIG. 3 shows the desired trajectories of neutralizing electrodes in a magnetic field.

A preferred embodiment overcomes this problem by using a two-fold approach that allows charge neutralization in the presence of the variable magnetic field of the SEM objective lens. The first aspect includes positioning and orienting the flood gun in a manner that considers the effect of the magnetic field. In other words, the flood gun is positioned and oriented so that the magnetic field accelerates the neutralizing electrons toward the target, rather than away from it. FIG. 3 shows schematically the trajectories 304 of the electrons from flood gun 204 as influenced by a magnetic field 302 directed into the plane of the paper. By positioning the flood gun 204 in a preferred position and orientation, electrons from the flood gun are impact the work piece surface 306 at the correct location and at a 90 degree angle.

Figure 4:
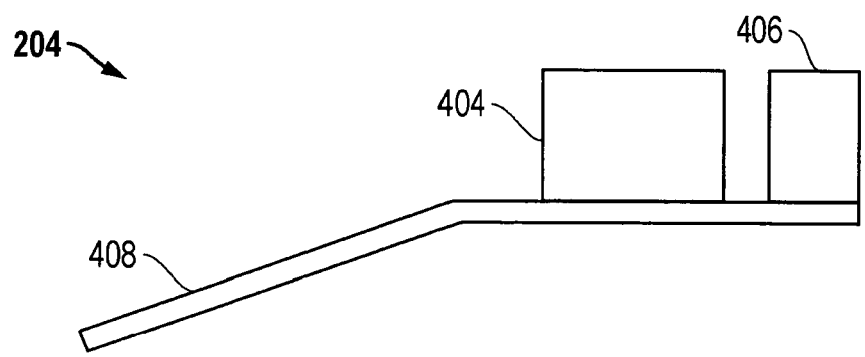
FIG. 4 shows an electron flood gun that can be used with the system of FIG. 1.

The second aspect of compensating for the magnetic field includes designing the flood gun for operation in a magnetic field. FIG. 4 shows a flood gun 204 useful in connection with the invention. Flood gun 204 includes two primary sections, a firing unit 404 comprising a tungsten wire that is heated to emit electrons, and an accelerating/steering/focusing unit 406 that includes electron optical parts that accelerate, steer, and focus the electrons. Both units are supported on a bracket 408 that is mounted onto the vacuum chamber. The flood gun 204 is preferably composed of non-magnetic materials to reduce distortion of the objective lens field.

Flood gun 204 includes steering electrodes that allow the beam of electrons to be directed. The beam is initially oriented to maximize the charge neutralization with an average magnetic field present. This orientation can be determined empirically. As the magnetic field changes on the SEM lens, the trajectories of the electrons in the neutralizing beam will change. The voltages on the steering electrodes are then adjusted to slightly steer the electrons back to the target to effect charge neutralization. The steering compensates to some extent for the deviation from ideal flood gun position and orientation.

Figure 5:
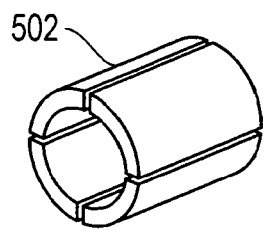
FIG. 5 shows an electron optical element used in the flood gun of FIG. 4

In a preferred embodiment, the same optical components can be used to both focus and steer the electron beam. The preferred component includes a cylindrical electrostatic lens 502 that is split into four sections as shown in FIG. 5. A focusing voltage can be applied equally to the four elements, and a steering voltage can be superimposed on top of the focusing voltage on opposing elements. By using the same elements to steer and accelerate the beam, the electron path within the flood gun is kept short by reducing the number of components. Keeping the electron path within in the flood gun short reduces the time that the magnetic field acts on the electrons in the flood gun beam. In another embodiment, a curved flood gun can be used to compensate for the curved electron trajectory in the flood gun caused by the magnetic field.

The flood gun is also preferably positioned such that electrons leaving the flood gun will be moved by the magnetic field toward the target, rather than away from the target. The preferred position of the flood gun varies with the specific application. The preferred position for the flood gun can be determined by performing a three dimensional simulation of the magnetic field generated by the SEM objective lens and combining that field with a three dimensional simulation of the electrostatic field within the flood gun. For example, applicants used Munro electron beam simulation software available from MEBS Ltd., London, UK to simulate the electron trajectories in the various fields. The configuration of the SEM objective gun lens is input into the MEBS program, and the program then determines the magnetic fields and calculates the trajectory of the electrons from the flood gun. The position and orientation of the flood gun in the simulation can be altered until the electrons land in the desired place.

Figure 6:
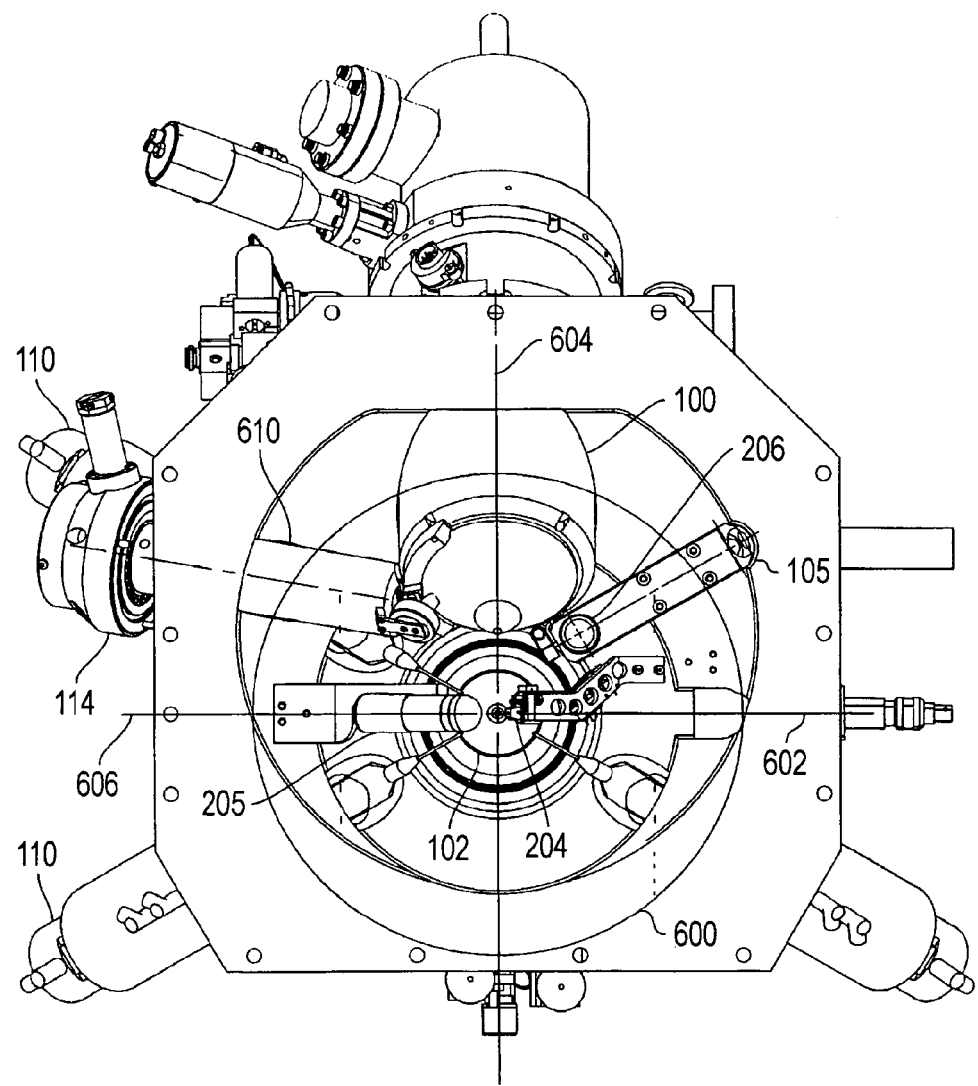
FIG. 6 shows a bottom view of the system of FIG. 1.
Figure 7:
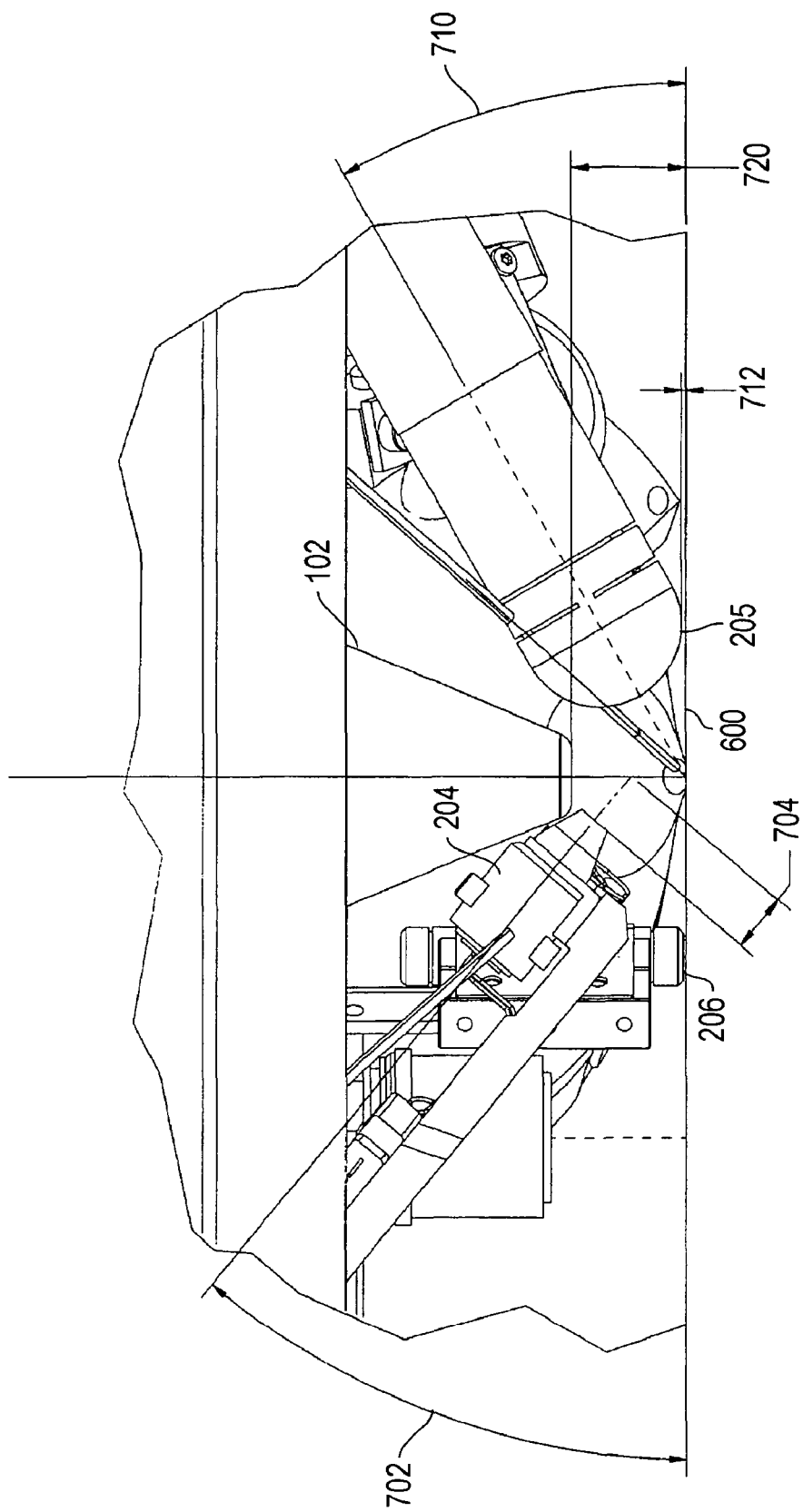
FIG. 7 shows a cross sectional view of a portion of the system of FIG. 1.

FIGS. 6 and 7 show the preferred orientations of the flood gun 204 and other components in one embodiment having a vertical FIB column 102 and an SEM column 100 oriented at 45 degrees aimed at a spot about 50 mm from the FIB target on a work piece 600, for example, a 300 mm silicon wafer. The objective lens of SEM column 100 is positioned about 1.4 mm from the target point. FIG. 6 shows the orientation of the various components viewed from underneath, that is, with the axis of the ion beam column 102 extending into the page. FIG. 7 shows a partial cross sectional view of the system of FIG. 6. FIG. 6 shows that the flood gun 204 is preferably positioned in a vertical plane that is ninety degrees clockwise, when viewed from below, from the vertical plane containing the SEM 100.

FIG. 7 shows that the flood gun 204 is oriented at an angle 702 of preferably about 40 degrees from the horizontal and that the end of the flood gun is positioned a distance 704 of about 8 mm from the target. FIG. 6 also shows part of the secondary particle detector 205 that detects electrons which were collected through the objective lens of the SEM and then were deflected off axis to a scintillator, which converts the electrons to light which is then routed out of the vacuum chamber via a light pipe to a detector.

Secondary Particle Detector for FIB

The FIB system typically includes a secondary particle detector 205, such as a channel detector electron multiplier (CDEM) that detects secondary particles that are generated when ions in the primary ion beam impact the work piece. Typically, such particle detectors can detect either electrons or ions, depending upon the voltages applied to the collector.

Figure 8:
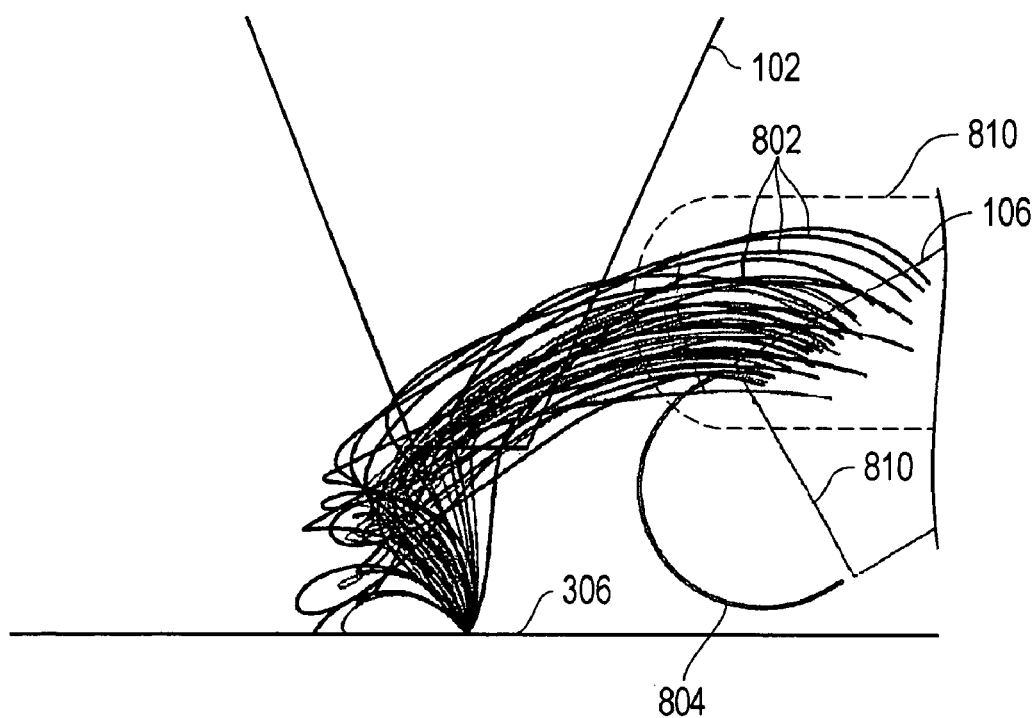
FIG. 8 is a simulation showing the trajectories of ion beam induced secondary electrons in the presence of a magnetic field.

Another problem caused by the magnetic field of the SEM objective is that some of the secondary particles emitted from the target are deflected away from the input of the secondary particle detector. FIG. 8 is a charged particle simulation, showing ion beam column 102, particle detector 205, and trajectories 802 of secondary electrons. Particle detector 205 includes a screen 804 held at a positive electrical potential to attract electrons and an input 806 through which electrons pass to enter detector 205. FIG. 8 shows that, in the presence of the magnetic field from the SEM objective lens, most of the electrons generated at the work piece surface by the impact of the ions in the primary beam do not enter input 806 and are not therefore detected.

Figure 9:
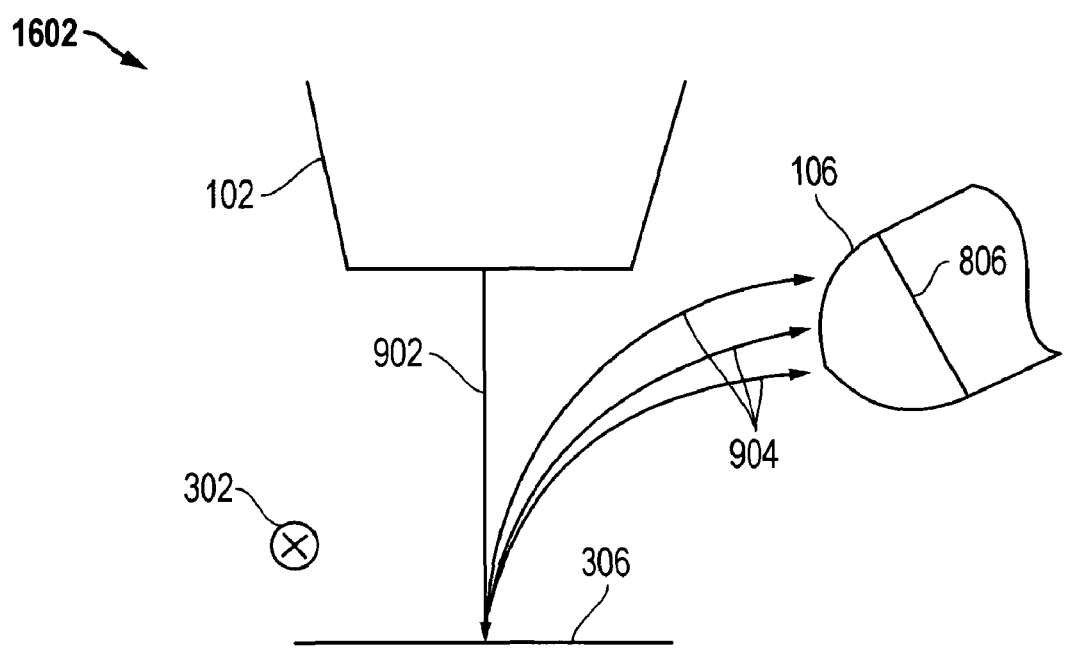
FIG. 9 shows the desired trajectories of secondary electrons in the presence of magnetic field.
Figure 10:
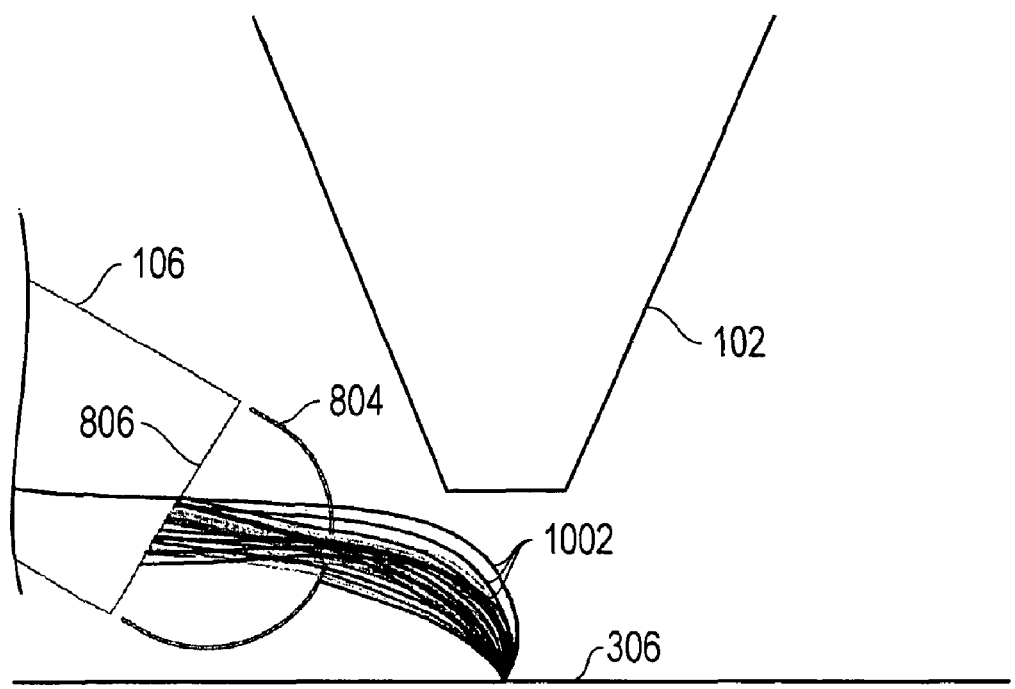
FIG. 10 is a simulation showing the preferred trajectories of secondary charged particles in the presence of magnetic field.

The problem is solved by strategically positioning the secondary particle detector, so that the magnetic field of the objective lens bends the trajectories of the secondary particles toward the input of the detector. The ideal position and orientation for the detector can be determined using a simulation in a manner similar to the manner in which the position of the flood gun above was positioned. FIG. 9 shows that with proper placement and orientation of the detector, secondary particles generated by primary ion beam 902 follow trajectories 904 that lead them to the input of detector 205 in the presence of magnetic field 302. FIG. 10 is a simulation showing trajectories 1002 of electrons generated by the impact of the primary ion beam from FIB 102. FIG. 10 shows that all of the particles enter the input 806 of particle detector.

FIG. 6 shows that the secondary particle detector 205 is preferably located in a vertical plane that is perpendicular to a vertical plane containing the SEM optical axis. If a flood gun is present, the particle detector is located in the same vertical plane as the flood gun, but on the opposite side of the system, that is, the particle detector is in a half plane rotated 90 degrees clockwise (looking from above) from the half plane containing the SEM. FIG. 7 shows that the particle detector is oriented at an angle 710 of about 30 degrees from the work piece surface and that the detector is positioned a distance 712 of about 0.6 mm above the surface of work piece 600. The FIB column 102 is positioned a distance 720 of about 16 mm above surface 600.

In another embodiment, a secondary particle detector 810 (shown in dashed outline) could be positioned as shown in FIG. 8 at a place where the secondary particles would enter the detector, although this position could physically interfere with the flood gun, if one is present on the system.

SEM

One aspect of a preferred embodiment is the use of an SEM objective lens that has relatively constant thermal signature, even as the magnetic field is adjusted to change the focus. By constant thermal signature is meant that not only is the total power dissipation approximately constant in time, but the power dissipations at all spatial positions on the lens are also approximately constant in time. Such an SEM objective lens is described in assignee's co-pending application entitled "Improved Magnetic Lens," of Bierhoff et al., filed Jul. 14, 2003, which is hereby incorporated by reference. The objective lens is preferably maintained in an energized state with approximately a constant current flowing through the SEM objective lens regardless of which beam is in use, and chilled cooling water flowing constantly to cool the lens. The system remains in thermal equilibrium and waits for the system to stabilize are eliminated.

Figure 11:
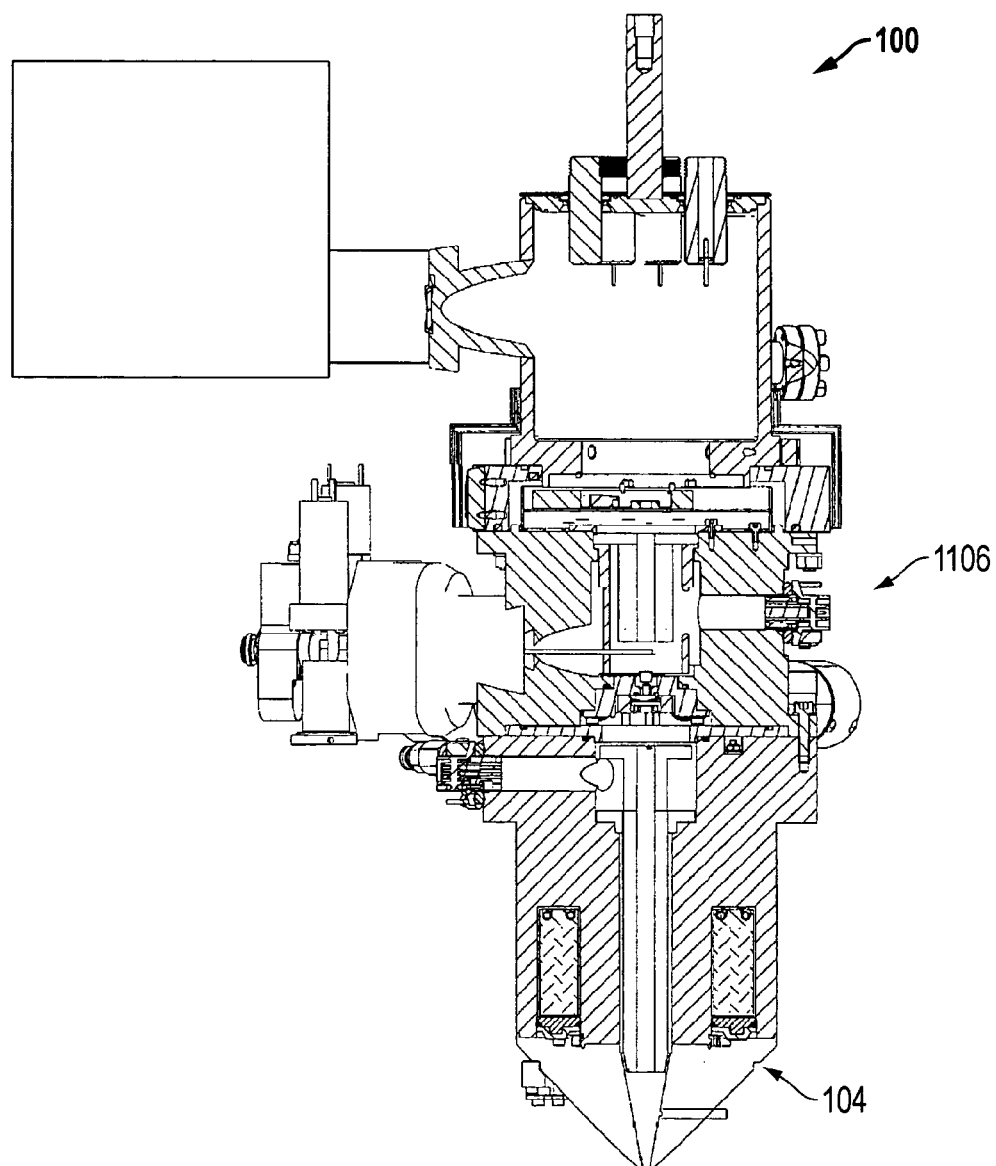
FIG. 11 shows a preferred scanning electron microscope column used in the system of FIG. 1.

FIG. 11 shows a preferred SEM column 100. The SEM includes a magnetic objective lens 1104 as described in the above-referenced patent application and preferably uses electrostatic deflection 1106. Using electrostatic deflectors allows both the electron beam and the ion beam to be controlled using similar mechanisms, which makes system operation easier. Electrostatic deflectors also allow for fast scanning and do not produce the heat variation of magnetic deflectors. If magnetic deflectors were used, the current in magnetic deflectors would need to change as the magnification of the microscope is changed. Changing the deflector current would change the heat output, which adversely affects the stability of the system.

Ion Beam

The magnetic field of the SEM lens also affects the trajectory of the ions in the primary ion beam. Although it is possible to steer the ion beam in a convention manner to compensate for the shift in position caused by the magnetic field, the resolution of the beam degrades in the presence of the magnetic field. Applicants have found that by using a liquid metal ion source of monoisotopic gallium, the resolution of the ion beam system is enhanced.

Naturally occurring gallium is dual isotopic, that is, it is a mixture of two isotopes: one isotope, which comprises about 60 percent of the atoms in naturally occurring gallium, has an atomic mass of about 69 and a second isotope, which comprises about 40 percent of the atoms in naturally occurring gallium, has an atomic mass of about 71. The two isotopes are deflected differently in a strong magnetic field, so the different isotopes will split into two beams, which impact the target at slightly offset spots. This "double spot" results in poor image quality and poor resolution micromachining.

Figure 12:
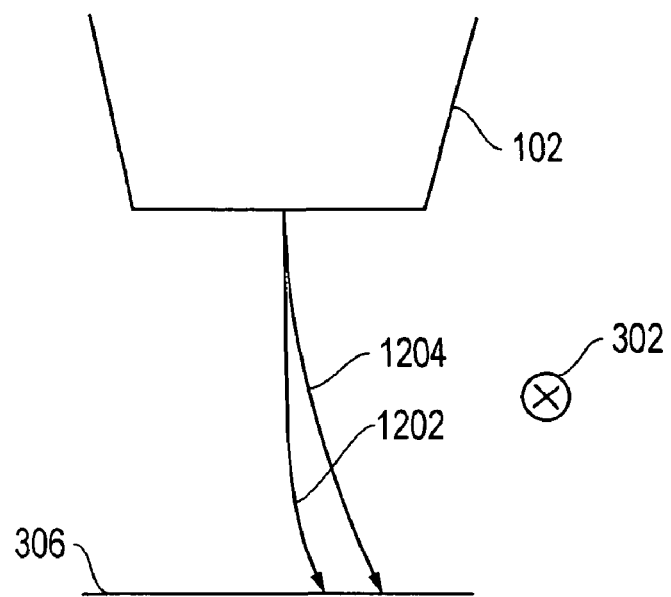
FIG. 12 shows the trajectories of gallium ions in a focused ion beam using a source composed of naturally occurring gallium.
Figure 13A:
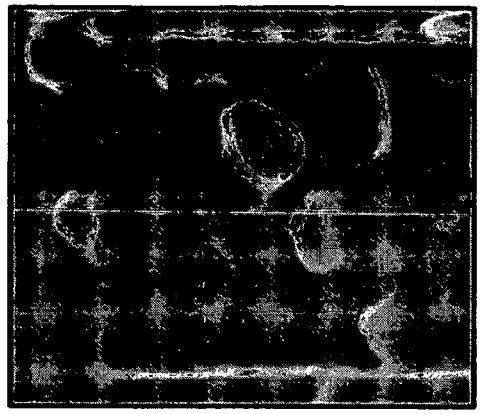
FIG. 13A is a focused ion beam image formed using a beam of dual isotopic gallium in the presence of the minimum magnetic field produced by the magnetic objective lens of a nearby scanning electron microscopic.
Figure 13B:
FIG. 13B is a focused ion beam image formed using a beam of dual isotopic gallium in the presence of the maximum magnetic field produced by the magnetic objective lens of a nearby scanning electron microscopic.

FIG. 12 shows the path of gallium ions 1202 having an atomic mass of about 71 and gallium ions 1204 having an atomic mass of about 69 in the magnetic field 302 originating from the SEM objective lens. The magnetic field 302 is in a direction into the plane of the paper. FIGS. 13A and 13B shows FIB images formed using naturally occurring, dual isotopic gallium ions from a gallium liquid metal ion source in the presence of a magnetic field from a SEM objective lens. In FIG. 13A, the magnetic field strength is at a minimum strength and the image is relatively sharp. In FIG. 13B, the magnetic field strength is at a maximum strength, and the image is noticeably blurry.

Figure 14:
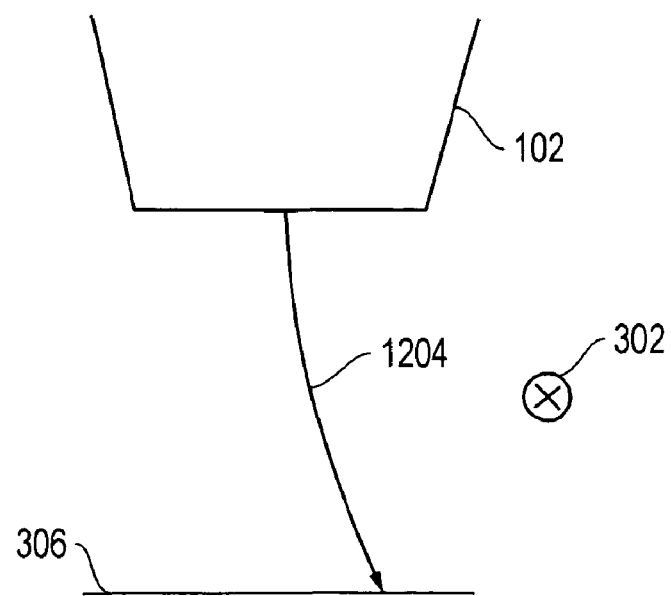
FIG. 14 shows the trajectories of gallium ions in a focused ion beam using monoisotopic gallium.
Figure 15A:
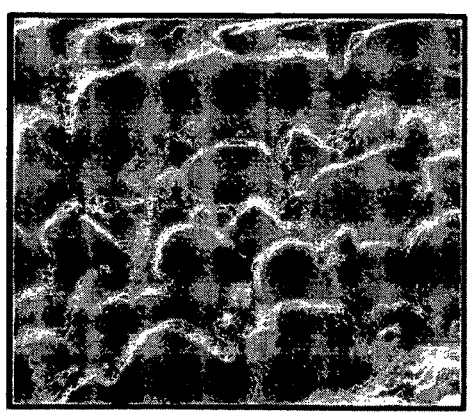
FIG. 15A is a focused ion beam image formed using a beam of monoisotopic gallium in the presence of the minimum magnetic field produced by the magnetic objective lens of a nearby scanning electron microscopic.
Figure 15B:
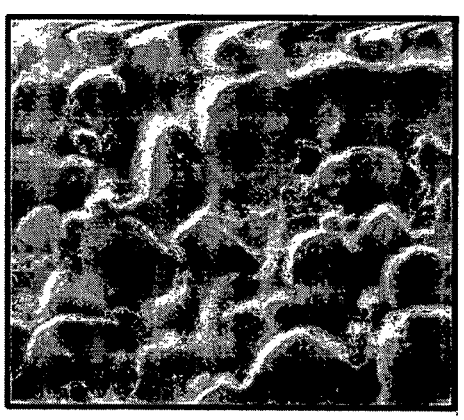
FIG. 15B is a focused ion beam image formed using a beam of monoisotopic gallium in the presence of the maximum magnetic field produced by the magnetic objective lens of a nearby scanning electron microscopic.

FIG. 14 is similar to FIG. 12, but shows the use of monoisotopic gallium. Either of the two isotopes could be used. Monoisotopic gallium is used in time-of-flight mass spectrometers and so is readily available. FIG. 14 shows that with monoisotopic gallium, there is a single beam. FIGS. 15A and 15B shows FIB images formed using monoisotopic gallium ions from a gallium liquid metal ion source in the presence of a magnetic field from a SEM objective lens. In FIG. 15A, the magnetic field strength is at a minimum strength and the image is relatively sharp. In FIG. 15B, the magnetic field strength is at a maximum, and the image is still sharp.

Although the position of the beam landing will change as the magnetic field strength changes, the change in position can be compensated using the ion beam steering optics. There is no blurring in either image. Although monoisotopic gallium has been used in time-of-flight mass spectrometers, to applicants' knowledge it was not used in dual beam systems to overcome the problems caused by the action of the magnetic field on the gallium ion beam. FIG. 7 shows that the FIB is positioned a distance 714 of 16 mm above the surface of work piece 600.

Load Lock System

In a production environment, it is preferable that an operator can quickly move work pieces into and out of the dual beam system. Because the ion and electron beams operate in a vacuum chamber, it is necessary to open the chamber to remove or insert a work piece, and then the system must be evacuated again. The evacuation process is time consuming.

Figure 16A:
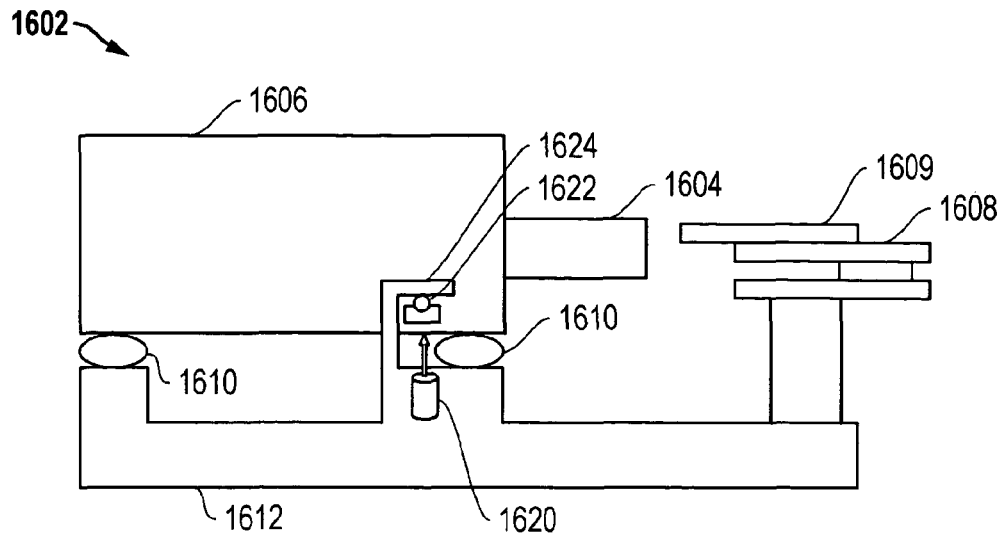
FIGS. 16A and 16B show a docking mechanism that can be used in the system of FIG. 1.
Figure 16B:
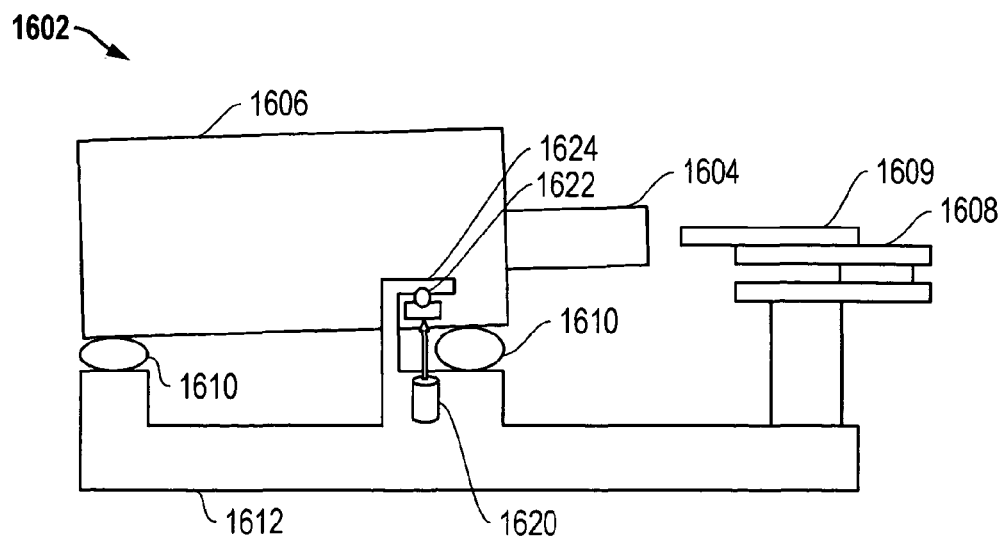

FIGS. 16A and 16B are block diagrams showing a preferred system 1602 that uses an "airlock" chamber 1604 that can be sealed and evacuated separately from a primary vacuum system 1606. A work piece can be inserted into the airlock chamber 1604, which is sealed and can be evacuated while the system 1602 is operating with a primary system vacuum chamber 1606 that is evacuated. After the airlock chamber 1604 is evacuated, it can be opened to the primary system vacuum chamber 1606 and work pieces can be exchanged between the two chambers without requiring primary system vacuum chamber 1606 to be opened to the atmosphere. A robotic arm 1608 loads a work piece, such as wafer 1609, onto a wafer holder (not shown) in airlock chamber 1604. A frame 1612 supports the primary vacuum chamber and the robotic arm 1608.

The airlock chamber 1604 preferably accommodates at least two work pieces, so that it can hold a new work piece and a completed work piece. The airlock chamber 1604 preferably has a small volume to reduce the time required to evacuate it.

The high resolutions of the SEM and FIB make the system sensitive to vibration. The primary vacuum chamber 1606, to which the ion and electron beam columns are mounted, "floats" on pneumatic cylinders 1610 above the system frame 1612 to stop the transmission of vibration from the floor. System 1602 typically includes an automatic leveler (not shown) that adjusts the air in the pneumatic cylinders 1610 so that the vacuum chamber 1606 system is level as it floats. To move the work piece to or from the airlock chamber 1604, it is necessary to "unfloat" the primary chamber 1606 and precisely position the airlock chamber 1604 so that the robotic arm 1608 can accurately locate and lift the work piece into or out of the airlock 1604. In the prior art, this alignment typically entailed deflating the pneumatic cylinders 1610 that supports the primary chamber 1606. Deflating the pneumatic cylinders 1610 takes time.

In a preferred embodiment, rather than deflating the pneumatic cylinders 1610, the primary chamber 1606 is forced up into a mating position, rather than being lowered into a mating position. The chamber can be forced up, for example, using a pneumatic or hydraulic cylinder 1620, an electric motor, or other means. The primary chamber 1606 is positioned, for example, by using two mating structures, one mating structure 1622 mounted on the primary vacuum chamber 1606 and a second mating structure 1624 mounted on the frame 1612.

For example, one or more acorn nuts mounted on the floating primary chamber can be forced into one or more mating holes mounted on the fixed system frame. Other alignment structures are well known. As the floating portion is forced up, the acorn nuts are forced into holes to align the primary chamber in three dimensions. One the airlock is aligned with the primary vacuum chamber, a robotic arm 1608 mounted on the frame can move a work piece to the airlock and retrieve a wafer from the airlock. Preferably, the automatic leveling is turned off, and only the side of the primary chamber by the air lock is forced up. The slight angle of the primary chamber resulting from forcing only one side up does not interfere with the work piece transfer. After the work pieces are transferred, the primary chamber is released by cylinder 1620 and settles back onto the pneumatic cylinders 1610, the automatic leveling is activated, and system operation can continue. By docking in the "up" position, a significant amount of time is saved by making it unnecessary to deflate and then reinflate the pneumatic cylinders.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A dual beam system comprising:
   an ion beam column for producing a primary ion beam;
   an electron beam column having a magnetic objective lens exhibiting an approximately constant thermal signature as the strength of the focusing field is varied;
   a floating portion upon which the ion column and the electron column are mounted;
   a fixed portion upon which an airlock is mounted;
   a robotic transfer arm mounted upon the floating portion;
   a first mating surface on the fixed portion and a second mating portion on the floating portion, the mating surfaces oriented such that when the floating potion is forced up, the mating surfaces align the floating portion with the fixed portion to allow the robotic transfer arm to transfer a work piece, and
   means for forcing the floating portion up to dock in alignment with the fixed portion.

2. A dual beam system, comprising:
   an ion beam column;
   an electron beam column;
   a primary system vacuum chamber to which the ion beam column and the electron beam column are mounted;
   an airlock;
   one or more pneumatic cylinders upon which the primary system vacuum chamber and the airlock are floated;
   a robotic transfer arm;
   a fixed portion upon which robotic transfer arm and the pneumatic cylinders are mounted;
   an automatic leveler for adjusting the air in the pneumatic cylinders to level the primary system vacuum chamber and the airlock as the primary system vacuum chamber and the airlock float on the pneumatic cylinders;
   means for forcing up the primary system vacuum chamber; and
   a first mating surface on the primary system vacuum chamber and a second mating surface on the fixed portion, the first mating surface and second mating surface being oriented such that when the primary system vacuum chamber is forced up, the mating surfaces position a loadlock with the fixed portion, thereby unfloating the system vacuum chamber and the loadlock to allow the robotic transfer arm to locate and lift a work piece into or out of the airlock.

3. A method of operating a dual beam system, the dual beam system including an ion beam system and an electron microscope, the electron microscope comprising an electron beam column, the electron beam column comprising a magnetic objective lens, the method comprising:
   directing a primary ion beam toward a work piece, the ion beam impacting the work piece;
   concurrently with directing the primary ion beam toward the work piece:
      operating the electron microscope so that an electron beam does not impact the work piece; and
      applying an electric current to the magnetic objective lens, the applied electric current being substantially equal to the electric current applied to the magnetic objective lens when the electron microscope is operated so that the electron beam impacts the work piece.

4. The method of claim 3, in which the dual beam system includes a charge neutralization flood gun, the method further comprising:
   positioning the charge neutralization flood gun so that the magnetic field of the magnetic objective lens assists in steering the neutralizing electrons to the target point of the focused ion beam system, and
   directing low energy electrons generated by the charge neutralization flood gun towards the work piece to neutralize at least some charge on the work piece while using the primary ion beam to impact the work piece.

5. The method of claim 4, in which directing the low energy electrons towards the work piece to neutralize at least a some charge on the work piece includes deflecting the low energy electrons using one or more steering electrodes in the charge neutralization flood gun.

6. The method of claim 3, in which the dual beam system includes a secondary particle detector, the method further comprising
   positioning the secondary particle detector so that the magnetic field of the magnetic objective lens assists in steering the secondary particles to the secondary particle detector; and
   detecting secondary particles generated by the impact of the primary ion beam with the work piece using the secondary particle detector.

7. The method of claim 3, in which using the ion beam to impact the work piece includes using a beam of monoisotopic gallium ions to impact the work piece.

* * * * *